(12) United States Patent
Seesink et al.

(10) Patent No.: US 8,196,475 B2
(45) Date of Patent: Jun. 12, 2012

(54) COINTEGRATED MEMS SENSOR AND METHOD

(75) Inventors: Peter Seesink, Oudoorp (NL); Horst Obermeier, Minden (DE); Omar Abed, Moorpark, CA (US); Dan Rodriguez, Moorpark, CA (US); Robert Hunter, Ventura, CA (US); Calin Miclaus, Camarillo, CA (US)

(73) Assignee: Kavlico Corporation, Moorpark ( * ) Notice: Subject to any disclaimer, the term of this patent is extended or adjusted under 35 U.S.C. 154(b) by 128 days.

(21) Appl. No.: 12/404,792

(22) Filed: Mar. 16, 2009

(65) Prior Publication Data

US 2010/0229651 A1      Sep. 16, 2010

(51) Int. Cl.
*G01L 7/08* (2006.01)

(52) U.S. Cl. .......... 73/715; 73/723; 73/753; 73/754

(58) Field of Classification Search .......... None
See application file for complete search history.

(56) References Cited

U.S. PATENT DOCUMENTS

| | | | |
|---|---|---|---|
| 2,993,815 A | 7/1961 | Treptow | |
| 4,168,518 A | 9/1979 | Lee | |
| 4,206,762 A | 6/1980 | Cosman | |
| 4,730,496 A | 3/1988 | Knecht | |
| 6,338,893 B1 | 1/2002 | Kodera | |
| 6,452,238 B1 * | 9/2002 | Orcutt et al. | 257/415 |
| 6,460,234 B1 | 10/2002 | Gianchandani | |
| 6,470,754 B1 | 10/2002 | Gianchandani | |
| 6,516,672 B2 | 2/2003 | Wang | |
| 6,660,564 B2 * | 12/2003 | Brady | 438/119 |
| 6,743,656 B2 * | 6/2004 | Orcutt et al. | 438/66 |
| 6,819,820 B1 * | 11/2004 | Chaparala et al. | 385/17 |
| 6,841,861 B2 * | 1/2005 | Brady | 257/678 |
| 6,872,319 B2 * | 3/2005 | Tsai | 216/2 |
| 6,888,979 B2 * | 5/2005 | Behin et al. | 385/18 |
| 6,952,042 B2 | 10/2005 | Stratton | |
| 7,071,016 B2 * | 7/2006 | Park et al. | 438/48 |
| 7,209,274 B2 * | 4/2007 | Van Drieenhuizen et al. | 359/224.1 |
| 7,456,497 B2 * | 11/2008 | Higashi | 257/704 |
| 7,781,238 B2 * | 8/2010 | Wodnicki et al. | 438/17 |
| 7,851,925 B2 * | 12/2010 | Theuss et al. | 257/774 |
| 2007/0199385 A1 | 8/2007 | O'Brien | |

* cited by examiner

*Primary Examiner* — Lisa Caputo
*Assistant Examiner* — Jermaine Jenkins
(74) *Attorney, Agent, or Firm* — Gilman Clark & Hunter LLC

(57) ABSTRACT

Described herein is a method for integrating MEMS with submicron semiconductor electrical circuits such as CMOS to provide more complex signal processing, on-chip calibration and integration with RF technologies. A MEMS sensor is provided having an upper layer, an insulating layer into which a cavity has been formed and a handle layer. The upper layer acts as both the substrate of the semiconductor electrical circuit and as the active MEMS element. The remainder of the circuitry is fabricated either in or on the upper layer. In a preferred method of the present invention a first wafer assembly and a second wafer assembly are fabricated such that a MEMS sensor and the substrate of at least one semiconductive electrical circuit is formed.

20 Claims, 2 Drawing Sheets

COINTEGRATED MEMS SENSOR AND METHOD

FIELD OF THE INVENTION

The present invention relates generally to devices with integrated mechanical and electrical semiconductor circuitry devices. One such example are MEMS devices.

BACKGROUND OF THE INVENTION

Sensors that contain both MEMS and semiconductor electrical circuits devices are well known in the art. Currently, the sensors are fabricated so that the MEMS and semiconductor electrical circuits are created at the same time, with the implant areas of the semiconductor electrical circuits implant located on the handle wafer adjacent to the active MEMS element. In order to integrate the semiconductor electrical circuits with the MEMS structure, temperatures of approximately 1000° C. are used in order that a strong bond of the SOI wafer to the MEMs wafer occurs and a clearly defined channel may be formed in the oxide layer of the MEMs device.

SUMMARY OF THE PREFERRED EMBODIMENTS

In a preferred embodiment of the present invention, a MEMS sensor assembly is provided having a first layer which in a preferred embodiment forms the active MEMS element, an insulating layer into which a cavity has been formed and a base or handle layer. The assembly further comprises at least one semiconductor electrical circuit which utilizes the first layer as a base substrate and in which the implant areas of the semiconductor electrical circuits are formed within the first layer.

In a preferred method of the present invention a first thin layer of insulating material is placed on a thick base substrate. At least one cavity is formed in the first thin layer of insulating material. A SOI wafer having a thin upper silicon layer, a second thin insulating layer and a thick silicon layer is bonded to the first layer of insulating material so that the thin upper silicon layer interfaces with the first layer of insulating material.

In a preferred method of the present invention, the thick silicon layer of the second wafer assembly is removed and at least a portion of the insulating layer of the second wafer assembly is removed. The thin upper silicon layer acts as both the substrate of the semiconductor electrical circuit and as the active MEMS element. The remaining components of the semiconductor electrical circuits are then fabricated directly on the thin upper silicon layer.

BRIEF DESCRIPTION OF THE DRAWINGS

The invention may be more readily understood by referring to the accompanying drawings in which.

DETAILED DESCRIPTION OF THE PREFERRED EMBODIMENTS

In the following descriptions of the invention, terms such as "front," "back," "top," "bottom," "side," "upper" and "lower" and the like are used herein merely for ease of description and refer to the orientation of the components as shown in the Figures.

Figure 1:
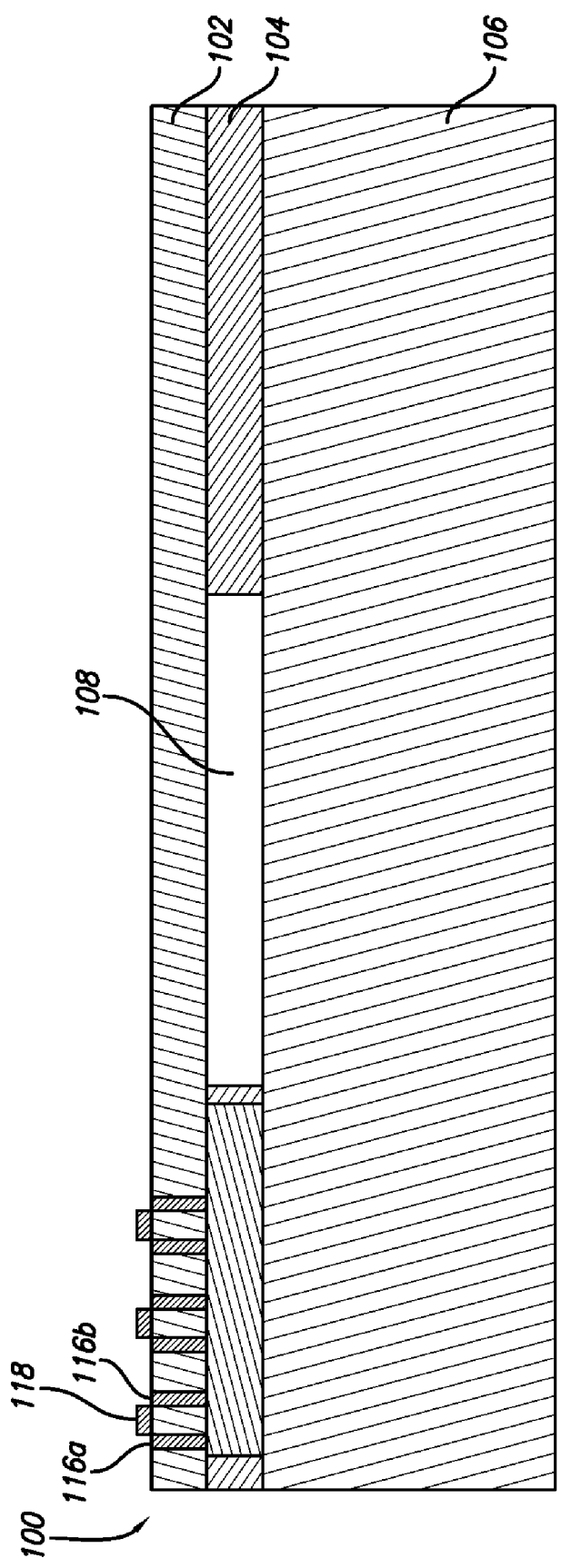
FIG. 1 is a cross-sectional plan view of the a preferred embodiment of the present invention.

Generally, the present invention may be briefly described as follows. Referring first to FIG. 1, a preferred embodiment of an integrated MEMS and semiconductor electrical circuit sensor 100 of the present invention is shown.

The MEMS sensor 100 comprises a top or device layer 102 a middle layer 104 and a bottom or handle layer 106. The top layer 102 is comprised of a thin semiconductor layer which in a preferred embodiment is a silicon wafer. The bottom layer 106 provides the support structure for the sensor 100 and, in a preferred embodiment, is a handle wafer comprised of silicon. In a preferred embodiment, the middle layer 104 is comprised of silicon oxide. However, any material which acts as an non-conductive and/or insulating material can be used.

In a preferred embodiment, a cavity 108 is formed in the middle layer 104 by either etching or masking the layer 104. However, any suitable method for creating a cavity 108 may be used. In alternate embodiments, the cavity may be formed in the base layer 106 or in the top layer 102 with suitable modifications of the device 100.

In the invention, the top layer 102 acts as both the substrate of the semiconductor electrical circuit and as the active mechanical element. Specifically, in a preferred embodiment, the semiconductor electrical circuit is fabricated on the thin upper silicon layer 102. By way of example and not limitation, the semiconductor electrical circuit in FIG. 1, comprises a plurality of CMOS devices in which implant areas 116a and 116b are shown over which gates 118 of the CMOS devices are placed. Additional electronics may also be placed on or in layer 102.

In an alternate embodiment (not shown) there is an additional layer of insulating material partially covering the top layer 102 onto which additional semiconductor electrical circuitry such as the gates or other electronics may be placed.

Figure 2:
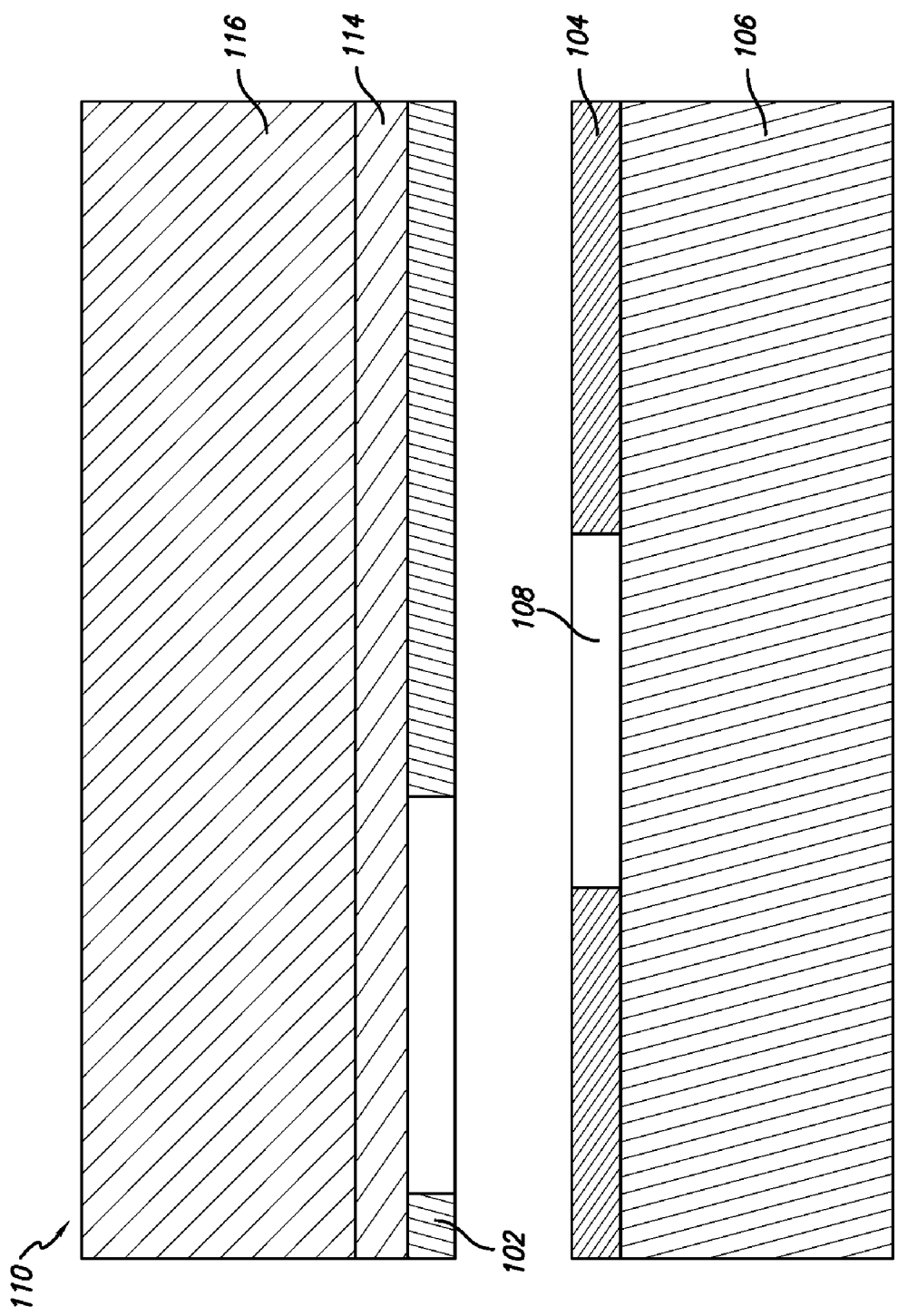
FIG. 2 is a cross-sectional plan view of one of the steps of a preferred method of the present invention Like numerals refer to like parts throughout the several views of the drawings.

Referring next to FIGS. 1 and 2, in a preferred method of the present invention, the MEMS sensor 100 is formed by taking a silicon wafer 106 and growing silicon oxide or another insulating material on the top thereof to form layer 104. In a preferred method of the present invention, a cavity 108 is etched in layer 104. However, any method of creating a clearly defined cavity in any of the layers may be used.

In the preferred method an SOI wafer 110 comprising a thin silicon layer 102, an insulating layer 114 and a handle layer 116 is then placed on layer 104 so that the thin silicon layer 102 rests across the entire layer 104. However, a solid SI wafer which has been thinned down may be used in place of the SOI wafer.

Thereafter, in a preferred method of the present invention, the layers are bonded together by high temperature fusing. In the temperature fusing method, temperatures of approximately 1000° C. are used. However, in lieu of temperature bonding any eutectic or anodic bonding can also be used with suitable modifications. However, any process which provides a strong bond and produces a controlled, well defined and well sealed cavity in any of the layers may be used.

Thereafter, if a SOI wafer has been used, the handle layer 116 of the SOI wafer 110 is removed leaving the top thin silicon layer 102 and the insulating layer 114. Depending upon the intended usage of the sensor, all or part of the insulating layer 114 of the SOI wafer 110 may be removed.

In a preferred method of the present invention, the remainder of the semiconductor electrical circuitry is then fabricated onto the thin upper silicon layer 102. Specifically, implant areas such as areas 116a and 116b, which comprise source and drain pads, are formed in the thin upper silicon layer 102.

In an alternate embodiment (not shown) when part of the insulating layer 114 remains on top of the thin silicon layer 102, additional circuitry or components which need to be isolated from the silicon layer 102 may be placed on top of the insulating layer 114. Likewise, in yet a further embodiment, the semiconductor electrical circuitry can be fabricated in or on the base layer 106.

In a preferred method of the present invention, the semiconductor electrical circuits and implant areas are created after the fabrication of the MEMS structure. Thus, there is less problems with the merging and/or diffusion of the implant areas that are created when they are made at the same time as the MEMS structure and thereby exposed to a high temperature during the MEMS structure bonding process. Further, in a preferred embodiment in which the semiconductor electrical circuits are located on or in the thin upper layer 102, there is no longer a need to isolate the components of the semiconductor electrical circuits from the MEMS. As a result, the sensors can be made much smaller and thus, can be used in many different applications.

It will be understood that the present invention allows for integration of sensors with submicron semiconductor electrical circuits which enables more complex signal processing, on-chip calibration and integration with RF technologies for development of wireless sensor networks. The invention also allows for the creation of suspended structures that could be released at the final step when all of the semiconductor electrical circuit processing has been completed.

Those skilled in the art will understand that this type fabrication can be used in pressure sensors, accelerometers, force sensors, humidity sensors and in switches used in TPMS, MAP, and in automotive, medical, airplane, heating, ventilating, air conditioning systems (HVAC), as well as other industrial and consumer, applications.

The embodiments and methods described above are exemplary embodiments and methods of the present invention. Those skilled in the art may now make numerous uses of, and departures from, the above-described embodiments and methods without departing from the inventive concepts disclosed herein. Thus, the construction of the embodiments and the use of the methods disclosed herein are not a limitation of the invention. Accordingly, the present invention is to be defined solely by the scope of the following claims.

What is claimed is:

1. A MEMS sensor comprising:
  a semiconductor electrical circuit,
  a first layer utilized as a substrate for the semiconductor electrical circuit and as an active element of the MEMS sensor,
  a base layer,
  a first insulating layer disposed between the first layer and the base layer, and
  a cavity that has been formed in the insulating layer;
  wherein the cavity does not extend beyond the insulating layer in which the cavity is formed and the semiconductor electrical circuit is formed on the first layer, and wherein the cavity is formed by removing material from the insulating layer.

2. The MEMS sensor of claim 1 further comprising implant areas within the first layer.

3. The MEMS sensor of claim 1 wherein the cavity is sealed or open to the environment.

4. The MEMS sensor of claim 1 further comprising a second insulating layer on the first layer.

5. The MEMS sensor of claim 1 wherein the first insulating layer is a thin layer of oxide.

6. The MEMS sensor of claim 1, wherein the cavity is sealed within the MEMS sensor.

7. The MEMS sensor of claim 1 wherein the cavity that has been formed in the insulating layer extends through the insulating layer but does not extend beyond the insulating layer.

8. A method for fabricating a MEMS sensor, comprising the steps of:
  forming an insulating layer on top of a handle wafer layer;
  bonding a thin semiconductive layer to the insulating layer;
  creating at least one depression in the insulating layer such that the depression does not extend beyond the insulating layer in which it is formed, wherein creating the depressions includes removing material from the insulating layer;
  forming implant areas in the thin semiconductive layer; and
  forming gates between the implant areas on the semiconductive layer to assemble semiconductor electrical circuits on the MEMS sensor.

9. The method of claim 8, wherein the thin semiconductive layer is part of a silicon-on-insulator (SOI) wafer, and the method further comprising the step of removing a silicon base layer and an insulating layer of the SOI wafer after the thin semiconductive layer has been bonded to the insulating layer and before the implant areas are formed.

10. The method of claim 8, wherein the thin semiconductive layer is part of a silicon insulator (SI) wafer which has been thinned down, and the method further comprising the step of removing an insulating layer of the SI wafer after the thin semiconductive layer has been bonded to the insulating layer and before the implant areas are formed.

11. The method of claim 8, wherein the thin semiconductive layer is part of a silicon-on-insulator (SOI) wafer and the method further comprising the step of removing the silicon base layer of the SOI wafer after the thin semiconductive layer has been bonded to the insulating layer and before the implant areas are formed and wherein the gate is formed on top of the insulating layer of the SOI wafer.

12. The method of claim 8, further comprising:
  sealing the depression within the MEMS sensor.

13. The method of claim 8 wherein the depression extends through the insulating layer but does not extend beyond the insulating layer.

14. A method for fabricating a MEMS sensor, comprising the steps of:
  forming an insulating layer on top of a handle wafer layer;
  bonding a silicon top layer of a silicon-on-insulator (SOI) wafer to the insulating layer;
  creating at least one cavity in the insulating layer such that the cavity does not extend beyond the insulating layer in which it is formed, wherein creating the cavity includes removing material from the insulating layer;
  forming implant areas in the silicon top layer; and
  forming electrical connections between the implant areas in the silicon top layer.

15. The method of claim 14, further comprising the step of removing the silicon base layer of the SOI wafer after the thin semiconductive layer has been bonded to the insulating layer and before the implant areas are formed in the silicon top layer.

16. The method of claim 14, further comprising:
  sealing the depression within the MEMS sensor.

17. The method of claim 14 wherein the cavity extends through the insulating layer but does not extend beyond the insulating layer.

18. A method of sensing an environmental variable on a MEMS device comprising:

integrating a semiconductor electrical circuit onto the MEMS device,
forming a cavity in the MEMS device to create an active element of the MEMS device such that the cavity does not extend beyond the layer in which it is formed, wherein forming the cavity includes removing material from the layer in which the cavity is formed,
responding to a change in the environmental variable through movements of the active element, and
measuring a change in current with the semiconductor electrical circuit, wherein the change in current is caused by the movements of the active element.

19. The method of claim 18, wherein the active element acts as a diaphragm.

20. The method of claim 18, wherein the cavity is sealed within the MEMS device.

* * * * *